(12) United States Patent
Zhou (10) Patent No.: US 10,936,845 B2
(45) Date of Patent: Mar. 2, 2021

(54) OLED DISPLAY PANEL AND UNDER-SCREEN OPTICAL FINGERPRINT RECOGNITION METHOD

(71) Applicant: Wuhan China Star Optoelectronics Semiconductor Display Technology Co., Ltd., Wuhan (CN)

(72) Inventor: Shang Zhou, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/470,217

(22) PCT Filed: Mar. 19, 2019

(86) PCT No.: PCT/CN2019/078705
§ 371 (c)(1),
(2) Date: Jun. 16, 2019

(87) PCT Pub. No.: WO2020/133738
PCT Pub. Date: Jul. 2, 2020

(65) Prior Publication Data
US 2020/0184178 A1    Jun. 11, 2020

(30) Foreign Application Priority Data
Dec. 24, 2018  (CN) .......................... 201811580411.7

(51) Int. Cl.
*G06K 9/00*  (2006.01)
*H01L 27/32*  (2006.01)
(Continued)

(52) U.S. Cl.
CPC .......... *G06K 9/0004* (2013.01); *H01L 27/323* (2013.01); *H01L 51/5012* (2013.01); *H01L 51/5237* (2013.01)

(58) Field of Classification Search
CPC . G06K 9/0004; H01L 27/323; H01L 51/5012; H01L 51/5237
See application file for complete search history.

(56) References Cited

U.S. PATENT DOCUMENTS

2016/0093678 A1*  3/2016  Seo .................... H01L 51/5234
                                                    257/89
2017/0242533 A1*  8/2017  Liu ...................... G06F 3/0416
(Continued)

FOREIGN PATENT DOCUMENTS

| CN | 107066162 | 8/2017 |
| CN | 107579101 | 1/2018 |

(Continued)

*Primary Examiner* — Stephen G Sherman (57) ABSTRACT

An OLED display panel and an under-screen optical fingerprint recognition method are provided. In the OLED display panel, light sensitive units for optical fingerprint recognition are assembled in an OLED module functional layer and located on a same film layer where an anode of an organic electroluminescence device is located on, and located at gaps between the anodes. Such a structure reduces a path for light propagation, increases intensity of light received by the light sensitive units, and improves accuracy and efficiency in fingerprint recognition.

7 Claims, 3 Drawing Sheets

(51) Int. Cl.
*H01L 51/52* (2006.01)
*H01L 51/50* (2006.01)

(56) References Cited

U.S. PATENT DOCUMENTS

| | | | |
|---|---|---|---|
| 2018/0019288 A1 | 1/2018 | Yang et al. | |
| 2018/0060641 A1* | 3/2018 | Kim | G06K 9/0004 |
| 2018/0089485 A1 | 3/2018 | Bok | |
| 2018/0233531 A1 | 8/2018 | Huang et al. | |
| 2019/0067385 A1 | 2/2019 | Xu et al. | |
| 2019/0197282 A1* | 6/2019 | Gong | G02F 1/133512 |

FOREIGN PATENT DOCUMENTS

| | | |
|---|---|---|
| CN | 107870689 | 4/2018 |
| CN | 108258024 | 7/2018 |
| CN | 108427908 | 8/2018 |
| CN | 108598111 | 9/2018 |

\* cited by examiner

OLED DISPLAY PANEL AND UNDER-SCREEN OPTICAL FINGERPRINT RECOGNITION METHOD

RELATED APPLICATIONS

This application is a National Phase of PCT Patent Application No. PCT/CN2019/078705 having International filing date of Mar. 19, 2019, which claims the benefit of priority of Chinese Patent Application No. 201811580411.7 filed on Dec. 24, 2018. The contents of the above applications are all incorporated by reference as if fully set forth herein in their entirety.

FIELD AND BACKGROUND OF THE INVENTION

The present application relates to display technologies, and more particularly to an organic light emitting diode (OLED) display panel having a function of optical fingerprint recognition and an under-screen optical fingerprint recognition method.

DESCRIPTION OF RELATED ARTS

Fingerprint recognition technologies for mobile phones are classified into capacitive, optical, and ultrasonic types. The capacitive type usually captures user fingerprint information using a "Home" key of a mobile phone or a capacitive sensor deployed in a rear portion of a main body of the mobile phone. However, it is difficult for this approach to place a capacitive fingerprint recognition sensor under a display screen to recognize user fingerprints. It is usually applicable to non-full screen display only and screen ratio may be decreased accordingly. The ultrasonic fingerprint recognition is to dispose an ultrasonic sensor under the display screen to carry out fingerprint recognition. However, it has problems such as low recognition accuracy and speed. The under-screen optical fingerprint recognition is to dispose an optical sensor under the display screen. It greatly increases the screen ratio and carries out a stable recognition without a need to directly contact a fingerprint module.

In existing arts, the under-screen optical fingerprint recognition usually places an optical fingerprint recognition module at a back side of a substrate of an entire OLED illumination panel. In this approach, light emitted from OLEDs located above the substrate is reflected by the fingerprint, and then passes through the whole thickness of the OLED panel to reach the fingerprint recognition module. In this approach, paths for light transmission are quite long. The intensity of the light arriving at the fingerprint recognition module is small because of a large loss of the light. This affects efficiency and accuracy of fingerprint recognition.

SUMMARY OF THE INVENTION

An objective of the present application is to provide an OLED display panel having an optical fingerprint recognition and an under-screen optical fingerprint recognition method, for solving the problem of low accuracy and efficiency of fingerprint recognition in the existing under-screen optical fingerprint recognition approaches.

To achieve above objective, an aspect of the present application provides an OLED display panel, including:
a substrate;
a semiconductor layer, disposed above the substrate;
a first insulating layer, disposed on the semiconductor layer and above the substrate;
a gate electrode layer, disposed on the first insulating layer, the gate electrode layer forming a gate electrode of a semiconductor device;
a second insulating layer, disposed on the gate electrode layer and the first insulating layer;
a source drain metal layer, disposed on the second insulating layer and filling into a source electrode via and a drain electrode via formed in the first insulating layer and the second insulating layer, the source drain metal layer electrically connected to the semiconductor layer via the source electrode via and the drain electrode via, the source drain metal layer forming a source electrode and a drain electrode of the semiconductor device;
a third insulating layer, disposed on the source drain metal layer and the second insulating layer;
an anode layer, disposed on the third insulating layer and filling into an anode via formed in the third insulating layer, the anode layer electrically connected to the drain electrode of the semiconductor device via the anode via;
an organic light emitting layer, disposed on the anode layer;
a cathode layer, disposed on the organic light emitting layer;
an organic electroluminescence device, including an anode formed by the anode layer, the organic light emitting layer, and a cathode formed by the cathode layer;
a fourth insulating layer, disposed on the anode layer and the third insulating layer, the fourth insulating layer perforated to form a device via, the light emitting layer and the cathode of the organic electroluminescence device sequentially disposed on the anode layer via the device via; and
a light sensitive unit, disposed on the third insulating layer and covered by the fourth insulating layer, configured to receive reflected light generated when light emitted by the organic light emitting layer of the organic electroluminescence device is reflected by a fingerprint, and to transform optical signals into differential electrical signals to form a fingerprint image, based on differences between light rays reflected by fingerprint ridges and furrows.

In an embodiment of the present application, the third insulating layer is a flat layer and the fourth insulating layer is a pixel defining layer.

In an embodiment of the present application, the OLED display panel further includes:
a thin film encapsulation layer, disposed above the fourth insulating layer, the thin film encapsulation layer including an inorganic layer and an organic layer for avoiding invasion of oxygen and moisture; and
a touch electrode layer, disposed above the thin film encapsulation layer, configured to detect a touch operation.

In an embodiment of the present application, the OLED display panel further includes:
a light blocking layer, disposed above the organic electroluminescence device and the light sensitive unit, the light blocking layer having a plurality of first regions and a plurality of second regions, the first regions having a first light transmittance and the second regions having a second light transmittance lower than the first light transmittance, the first regions of the light blocking layer disposed corresponding to a light emitting region of the organic electroluminescence device and the light sensitive unit.

In another aspect, the present application provides an OLED display panel, including:
an OLED module functional layer, including a plurality of film layer;

a plurality of organic electroluminescence devices, distributed in the OLED module functional layer, each organic electroluminescence device including an anode, a cathode, and an organic light emitting layer disposed between the anode and the cathode;

a plurality of semiconductor devices, each of which is disposed corresponding to the organic electroluminescence display device, configured to drive the organic electroluminescence device to make the organic light emitting layer emit light; and a plurality of light sensitive units, distributed in the OLED module functional layer, located on a same film layer where the anode of the organic electroluminescence device is located on, and located at gaps between the anodes, the light sensitive units configured to receive reflected light generated when light emitted by the organic light emitting layer of the organic electroluminescence device is reflected by a fingerprint, and to transform optical signals into differential electrical signals to form a fingerprint image, based on differences between light rays reflected by fingerprint ridges and furrows.

In an embodiment of the present application, the OLED display panel further includes:

a substrate;

a semiconductor layer, disposed above the substrate;

a first insulating layer, disposed on the semiconductor layer and above the substrate;

a gate electrode layer, disposed on the first insulating layer, the gate electrode layer forming a gate electrode of a semiconductor device;

a second insulating layer, disposed on the gate electrode layer and the first insulating layer;

a source drain metal layer, disposed on the second insulating layer and filling into a source electrode via and a drain electrode via formed in the first insulating layer and the second insulating layer, the source drain metal layer electrically connected to the semiconductor layer via the source electrode via and the drain electrode via, the source drain metal layer forming a source electrode and a drain electrode of the semiconductor device; and a third insulating layer, disposed on the source drain metal layer and the second insulating layer.

In an embodiment of the present application, the OLED display panel further includes:

an anode layer, disposed on the third insulating layer and filling into an anode via formed in the third insulating layer, the anode layer electrically connected to the drain electrode of the semiconductor device via the anode via, the anode layer forming the anode of the organic electroluminescence device; and a fourth insulating layer, disposed on the anode layer and the third insulating layer, the fourth insulating layer perforated to form a device via, the light emitting layer and the cathode of the organic electroluminescence device sequentially disposed on the anode layer via the device via.

In an embodiment of the present application, the light sensitive units are disposed on the third insulating layer and covered by the fourth insulating layer.

In an embodiment of the present application, the third insulating layer is a flat layer and the fourth insulating layer is a pixel defining layer.

In an embodiment of the present application, the OLED display panel further includes:

a thin film encapsulation layer, disposed above the fourth insulating layer, the thin film encapsulation layer including an inorganic layer and an organic layer for avoiding invasion of oxygen and moisture; and a touch electrode layer, disposed above the thin film encapsulation layer, configured to detect a touch operation.

In an embodiment of the present application, the OLED display panel further includes:

a light blocking layer, disposed above the organic electroluminescence device and the light sensitive unit, the light blocking layer having a plurality of first regions and a plurality of second regions, the first regions having a first light transmittance and the second regions having a second light transmittance lower than the first light transmittance, the first regions of the light blocking layer disposed corresponding to a light emitting region of the organic electroluminescence device and the light sensitive unit.

In still another aspect, the present application provides an under-screen optical fingerprint recognition method, including:

utilizing a touch component to determine a touch position of a touch event on an organic light emitting diode (OLED) display panel, the touch event defined by a finger operation;

changing illumination properties at a position on the OLED display panel corresponding to the touch position by adjusting a driving electric current; and utilizing an array of light sensitive units disposed in the OLED display panel to receive reflected light generated when light emitted by the organic light emitting layer of the organic electroluminescence device is reflected by a fingerprint, and to transform optical signals into differential electrical signals to form a fingerprint image, based on differences between light rays reflected by fingerprint ridges and furrows.

In an embodiment of the present application, the changing the illumination properties includes:

changing brightness of an organic luminescent material in the OLED display panel at a position corresponding to the touch position or a ratio of brightness of any two types of organic luminescent materials at a position corresponding to the touch position.

In an embodiment of the present application, the OLED display panel includes a plurality of organic electroluminescence device, each of which includes an anode, a cathode, and an organic light emitting layer disposed between the anode and the cathode, the array of light sensitive units is located on a same film layer where the anode of the organic electroluminescence device is located on, and each of the light sensitive units is located at gaps between the anodes.

In the OLED display panel of the present application, the light sensitive units for optical fingerprint recognition are assembled in the OLED module functional layer and located on a same film layer where the anode of the organic electroluminescence device is located on, and located at gaps between the anodes. Compared to individually disposing an optical fingerprint recognition module on a rear face of a substrate of an OLED module in existing arts, the present application makes the most of film layer space and reduces paths for light propagation, and thus can improve accuracy and efficiency in fingerprint recognition and reduce the whole thickness occupied by a fingerprint recognition module. In some embodiments, the OLED display panel of the present application deploys the light blocking layer, which can increase a signal to noise ratio in fingerprint recognition and improve sensitivity and efficiency of the fingerprint recognition. The under-screen optical fingerprint recognition method of the present application makes the most of self-illumination properties of OLED pixels without a need to add an additional light source, utilizes the touch component to determine the position of the fingerprint, and makes the OLED pixels corresponding to a touched region irradiate light rays to realize the fingerprint recognition.

DESCRIPTION OF SPECIFIC EMBODIMENTS OF THE INVENTION

To make the objectives, technical schemes, and effects of the present application more clear and specific, the present application is described in further detail below with reference to the embodiments in accompanying with the appending drawings. It should be understood that the specific embodiments described herein are merely for explaining the present application, the term "embodiment" used in the context means an example, instance, or illustration, and the present application is not limited thereto.

The present application provides an organic light emitting diode (OLED) display panel equipped with a function of under-screen optical fingerprint recognition. In the OLED display panel, light sensitive units for optical fingerprint recognition are assembled in an OLED module functional layer. This reduces a path for light propagation during fingerprint recognition and improves accuracy and efficiency in fingerprint recognition.

Figure 1:
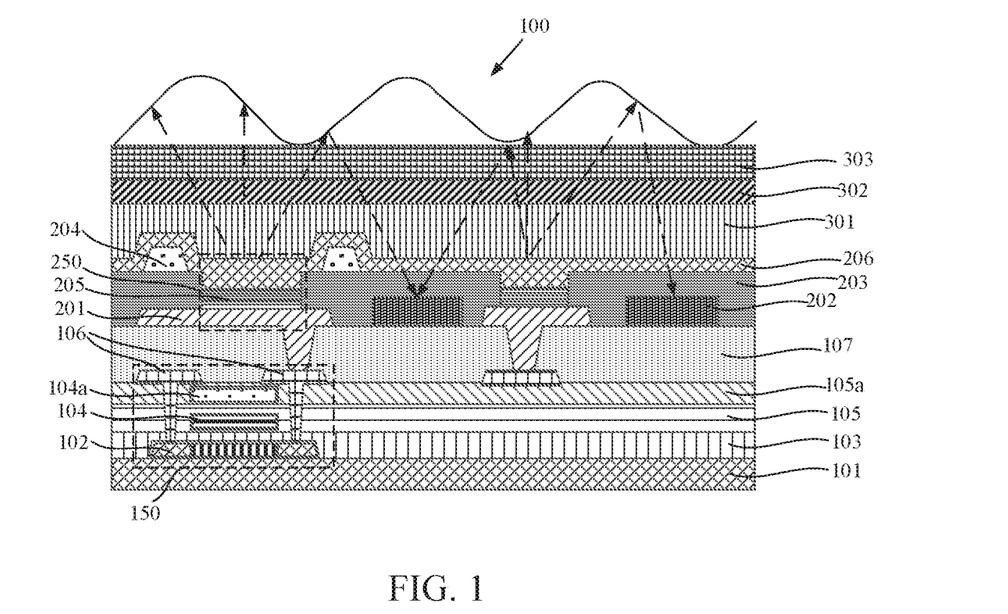
FIG. 1 is a schematic diagram illustrating an OLED display panel according to a first embodiment of the present application.

FIG. 1 is a schematic diagram illustrating an OLED display panel 100 according to a first embodiment of the present application. The OLED display panel 100 may be a touch display panel having a touch position sensing function. The OLED display panel 100 includes a plurality of semiconductor devices 150, and a plurality of organic electroluminescence devices 250 and a plurality of light sensitive units 202 distributed in an OLED module functional layer. The semiconductor devices 150 are configured to drive the organic electroluminescence devices 250 to emit light. The light sensitive units 202 are configured to receive reflected light generated when the light emitted by the organic electroluminescence devices 250 is reflected.

The OLED display panel 100 may include a substrate 101, a semiconductor layer 102, a first insulating layer 103, a gate electrode layer 104, a second insulating layer 105, a source drain metal layer 106, and a third insulating layer 107 that are used to form the semiconductor devices 150, and include an anode layer 201, a fourth insulating layer 203, an organic light emitting layer 205, and a cathode layer 206 that are used to form the organic electroluminescence devices 250 and construct the OLED module functional layer. The organic electroluminescence devices 250 are distributed in the OLED module functional layer. The light sensitive units are also distributed in the OLED module functional layer, and more specifically located on a same film layer where the anode layer 201 is located on. The OLED display panel 100 may further include a thin film encapsulation (TFE) layer 301 configured to avoid invasion of oxygen and moisture, and a touch electrode layer 303 configured to determine a touch position.

The semiconductor devices 150 can be thin-film transistors (TFTs). Each of the semiconductor devices or the TFTs 150 includes a gate electrode, a source electrode, and a drain electrode. Each of the organic electroluminescence devices 250 includes an anode, a cathode, and an organic light emitting layer disposed between the anode and the cathode. The organic light emitting layer is driven by an electric field between the anode and the cathode and emits light rays by injection and recombination of charge carriers (i.e., electrons and holes). Each of the semiconductor devices 150 is disposed corresponding to the organic electroluminescence display device 250, and is configured to drive the organic electroluminescence device 250 to make the organic light emitting layer emit light.

The semiconductor layer 102 is disposed above the substrate 101. The substrate 101 may be a glass substrate or a flexible substrate. The flexible substrate may be a polyimide (PI) substrate. A buffer layer (not shown) or other film layers (not shown) for increasing flexibility may also be disposed between the semiconductor layer 102 and the substrate 101. The material of the semiconductor layer 102 can be low-temperature polycrystalline silicon (LTPS). The semiconductor layer 102 has an undoped region at a middle portion and doped regions located at two sides of the undoped region. The semiconductor layer 102 may be formed by exposure, development, and etching processes. The first insulating layer 103 is a gate insulating layer disposed on the semiconductor layer 102 and above the substrate 101. The first insulating layer 103 can be a silicon nitride layer or a silicon dioxide layer. The first insulating layer 103 is deposited on the polycrystalline silicon layer 102 and the substrate 101 using chemical vapor deposition. The gate electrode layer 104 forms the gate electrode of the semiconductor device or the TFT 150. The gate electrode layer 104 is disposed on the first insulating layer. The gate electrode layer 104 can be made of Mo and can be formed by patterning using exposure, development, and etching processes. The second insulating layer 105 can be a dielectric interlayer and is disposed on the gate electrode layer 104 and the first insulating layer 103. The second insulating layer 105 can be a silicon nitride layer or a silicon dioxide layer. The second insulating layer 105 is deposited on the gate electrode layer 104 and the first insulating layer 103 using chemical vapor deposition. The source drain metal layer 106 forms the source electrode and the drain electrode of the semiconductor device or the TFT 150. The source drain metal layer 106 is disposed on the second insulating layer 105 and fills into a source electrode via and a drain electrode via formed in the first insulating layer 103 and the second insulating layer 105. The source drain metal layer 106 is electrically connected to the semiconductor layer 102 through the source electrode via and the drain electrode via. The material of the source drain metal layer 106 can be Ti/Al/Ti. The source drain metal layer 106 is patterned using exposure, development, and etching processes to obtain the source electrode and the drain electrode. The third insulating layer 107 is a flat layer and is disposed on the source drain metal layer 106 and the second insulating layer 104. The third insulating layer 107 can be a silicon nitride layer or a silicon dioxide layer and formed using chemical vapor deposition.

The OLED display panel 100 may further include another gate electrode layer 104a and another second insulating layer 105a. The another gate electrode layer 104 is disposed on the second insulating layer 105. The another second insulating layer 105a is disposed on the another gate electrode layer 104 and the second insulating layer 105. The source drain metal layer 106 is electrically connected to the semiconductor layer 102 through a source electrode via and a drain electrode via formed in the first insulating layer 103, the second insulating layer 105, and the another second insulating layer 105a, as shown in FIG. 1. In this example, the first insulating layer 103 and the second insulating layer 105 serve as the gate insulating layer and the another second insulating layer 105a serves as the dielectric interlayer. The another gate electrode layer 104a can be used to enhance channel properties of the semiconductor layer 102.

In the OLED module functional layer, the anode layer 201 forms the anode of the organic electroluminescence device 250. The anode layer 201 is disposed on the third insulating layer 107 and fills into an anode via formed in the third insulating layer 107. The anode layer 201 is electrically connected to the drain electrode of the semiconductor device or the TFT 150 through the anode via. The light sensitive units 202 are located on a same film layer where the anode of the organic electroluminescence device 250 is located on, and located at gaps between the anodes. The fourth insulating layer 203 is a pixel defining layer and is disposed on the anode layer 201 and the third insulating layer 107. Spacers 204 are disposed on the fourth insulating layer 203. The fourth insulating layer 203 and the spacers 204 can be formed simultaneously within on exposure using a halftone process. The fourth insulating layer 203 is perforated to form a device via. The spacers 204 are disposed at two sides of the device via. The organic light emitting layer 205 and the cathode of the organic electroluminescence device 250 are sequentially disposed on the anode layer 201 through the device via. The cathode extends from the device via to form the cathode layer 206 covering the fourth insulating layer 203 and the spacers 204. The cathode layer 206 is made of a transparent conductive metal such as indium tin oxide (ITO).

The OLED display panel 100 further includes a thin film encapsulation layer 301, a dielectric layer 302, and a touch electrode layer 303. The thin film encapsulation layer 301 is disposed above the fourth insulating layer 203. Specifically, the thin film encapsulation layer 301 is disposed on the cathode layer 206. The thin film encapsulation layer 301 includes one or more inorganic layer (not shown) and one or more organic layer (not shown) that are configured to avoid invasion of oxygen and moisture. The inorganic layers and the organic layers may be overlapped to each other. The dielectric layer 302 is disposed between the thin film encapsulation layer 301 and the touch electrode layer 303. The touch electrode layer 303 is disposed above the thin film encapsulation layer 303. Specifically, the touch electrode layer 303 is disposed on the dielectric layer 302 and is configured to detect a touch operation. The touch electrode layer 303 is a part of a touch sensing device and has scanning electrodes and sensing electrodes.

Specifically, the light sensitive units 202 are assembled in the OLED module functional layer and are located on a same film layer where the anode of the organic electroluminescence device 250 is located on. As shown in FIG. 1, the light sensitive units 202 are disposed between the third insulating layer 107 and the fourth insulating layer 203, that is, between the flat layer and the pixel defining layer. Similarly, the anode layer 201 is also disposed between the flat layer and the pixel defining layer. Specifically, the light sensitive units 202 are disposed on the third insulating layer 107 and covered by the fourth insulating layer 203. That is, the light sensitive units 202 are disposed on the flat layer and covered by the pixel defining layer. Similarly, the anode layer 201 is also disposed on the flat layer and covered by the pixel defining layer. Signal trances (not shown) between the light sensitive units 202 can be distributed on a film layer where the light sensitive units 202 and the anode layer 201 are located on.

Figure 2:
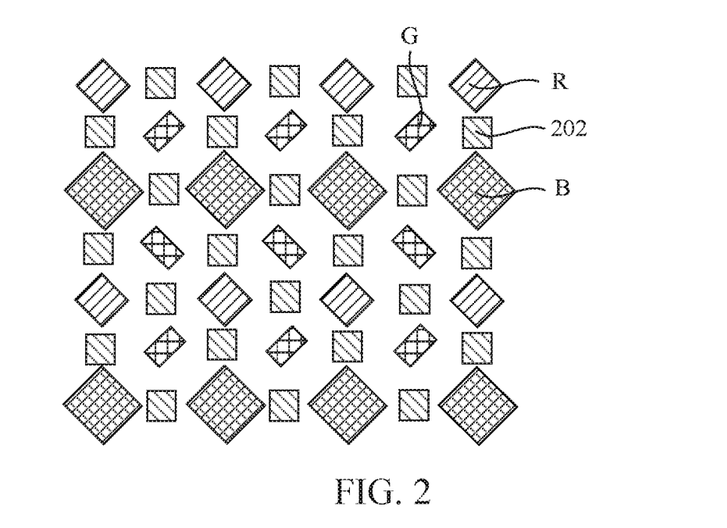
FIG. 2 is a diagram showing a positional relation between light sensitive units and pixels according to the present application.

FIG. 2 is a diagram showing a positional relation between light sensitive units and pixels according to the present application. FIG. 2 illustrates a relation between the light sensitive units 202 and OLED pixels for their relative positions on a plane. The light sensitive units 202 constructs an array of light sensitive units. The light sensitive units 202 are located at gaps between the OLED pixels. For example, the OLED display panel 100 includes red pixels R, green pixels G, and blue pixels B. The light sensitive units 202 can be evenly scattered into gaps between these pixels R, G, and B. The density, specific location, and size of the light sensitive units 202 may be varied as needed.

In an embodiment, the light sensitive units 202 are evenly distributed over all the area of the OLED display panel 100. In another embodiment, the light sensitive units 202 are evenly distributed over a certain region or certain local regions of the OLED display panel 100.

The dash lines in FIG. 1 illustrate paths for light propagation. As shown in FIG. 1, the light emitted from the organic light emitting layer 205 of the organic electroluminescence device 250 is reflected by a fingerprint. The light sensitive unit 202 receives the light reflected by the fingerprint. Optical signals are transformed into differential electrical signals to form a fingerprint image, based on differences between light rays reflected by fingerprint ridges and furrows. After reflected by the fingerprint, the light passes through few film layers and is immediately received by the light sensitive unit 202. Compared to disposing the light sensitive unit below the substrate, the present application effectively shortens the paths for light propagation.

In the OLED display panel 100 of the present application, the light sensitive units 202 for optical fingerprint recognition are assembled in the OLED module functional layer and located on a same film layer where the anode of the organic electroluminescence device 250 is located on, and located at gaps between the anodes. Compared to individually disposing an optical fingerprint recognition module on a rear face of a substrate of an OLED module in existing arts, the present application makes the most of film layer space and reduces paths for light propagation, and thus can improve accuracy and efficiency in fingerprint recognition and reduce the whole thickness occupied by a fingerprint recognition module.

Figure 3:
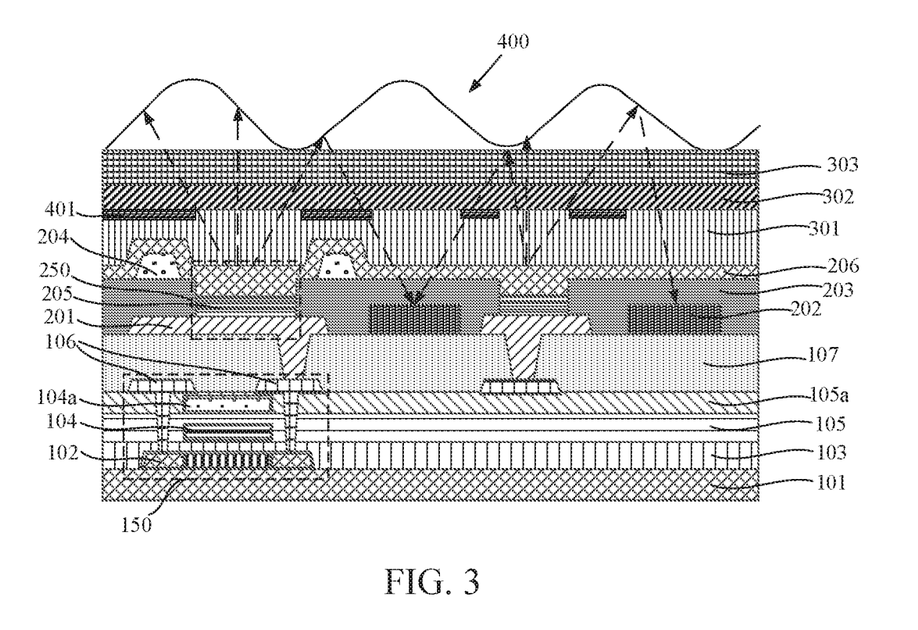
FIG. 3 is a schematic diagram illustrating an OLED display panel according to a second embodiment of the present application.
Figure 4:
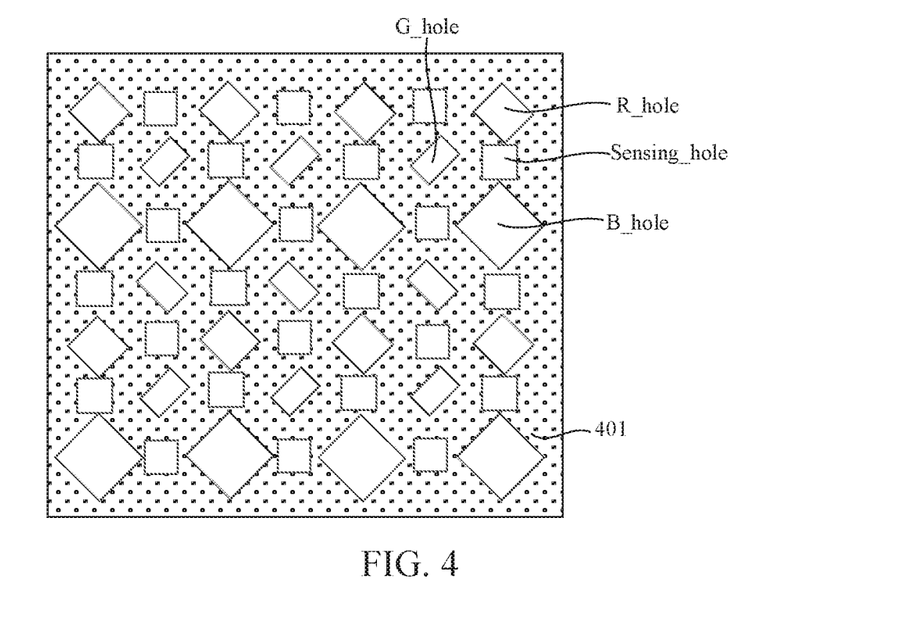
FIG. 4 is a schematic diagram showing openings of a light blocking layer according to the present application.

FIG. 3 is a schematic diagram illustrating an OLED display panel 400 according to a second embodiment of the present application. FIG. 4 is a schematic diagram showing openings of a light blocking layer 401 according to the present application. Referring to FIGS. 3 and 4, the differences between the second embodiment and the first embodiment of the present application are that the OLED display panel 400 of the second embodiment of the present application further includes a light blocking layer 401, which is made of an inorganic or organic material that is opaque or having low light transmittance. The light blocking layer 401 is disposed above the organic electroluminescence device 250 and the light sensitive units 202. For example, the light blocking layer 401 is disposed between the thin film encapsulation layer 301 and the dielectric layer 302, but is not limited thereto. The light blocking layer 401 can be formed by patterning the thin film encapsulation layer 301 and filling photoresist material into the pattern. The light blocking layer 401 has a plurality of first regions and a plurality of second regions. The first regions have a first light transmittance and the second regions have a second light transmittance lower than the first light transmittance. The first regions of the light blocking layer 401 are disposed corresponding to light emitting regions of the organic electroluminescence device 250 and the light sensitive units 202. The first regions are openings, for example. As shown in FIG. 4, the first regions can be red pixel openings R_hole, green pixel openings G_hole, blue pixel openings B_hole, and openings Sensing_hole corresponding to the light sensitive units. Preferably, the size and position of the openings of the light blocking layer 401 can be consistent with that of the OLED pixels. Of course, it can also change the size and position of the openings as needed.

The OLED pixels emit light in all directions. In order to make the light reflected by the fingerprint and received by the light sensitive units 202 mainly come from neighboring OLED pixels and reduce the affection by other light rays, the light blocking layer 401 is disposed to increase a signal to noise ratio in fingerprint recognition and improve sensitivity and efficiency of the fingerprint recognition.

Figure 5:
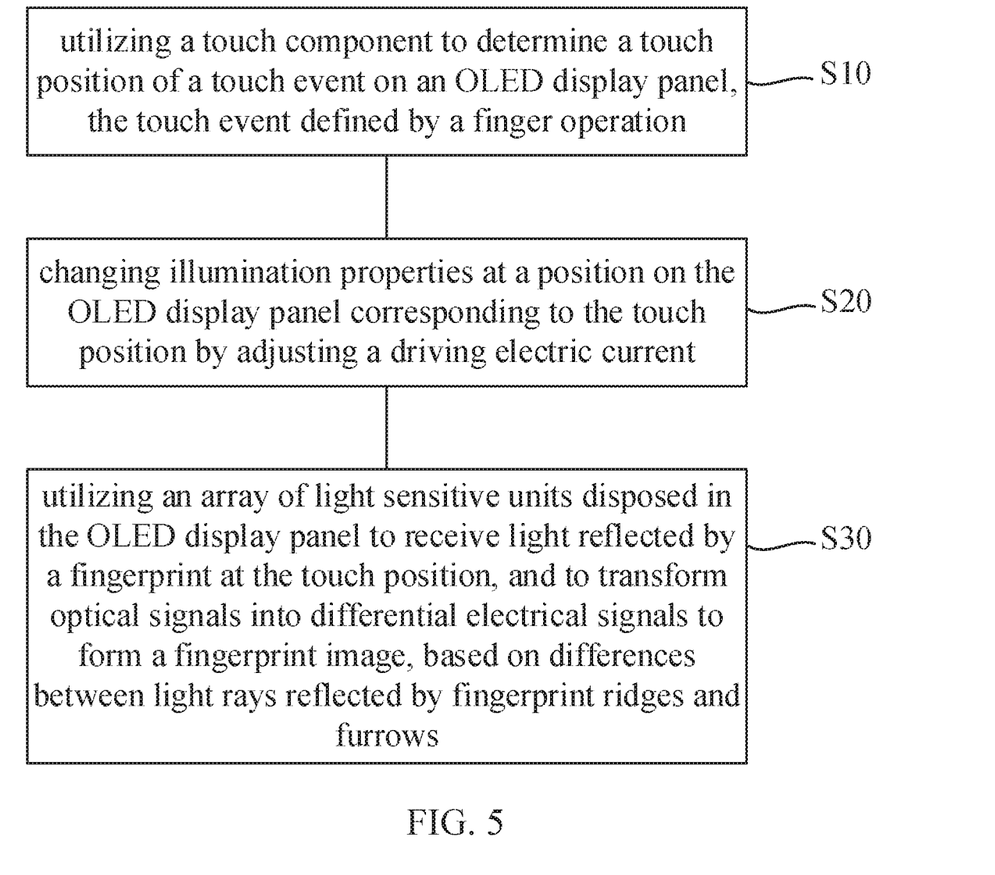
FIG. 5 is a flowchart of an under-screen optical fingerprint recognition method according to the present application.

FIG. 5 is a flowchart of an under-screen optical fingerprint recognition method according to the present application. The under-screen optical fingerprint recognition method of the present application includes the following steps.

S10—utilizing a touch component to determine a touch position of a touch event on an organic light emitting diode (OLED) display panel, the touch event defined by a finger operation. For example, when a finger touches a screen, a touch event is generated on the OLED display panel. The touch component detects the touch event and generates a signal indicative of a position touched by the finger.

S20—changing illumination properties at a position on the OLED display panel corresponding to the touch position by adjusting a driving electric current. In this step, a display driver makes OLED pixels located in a local region corresponding to the touch position emit light rays. That is, the OLED pixels located in the local region can be changed from a non-illuminating state to an illuminating state in a case that the device is standby and the display screen is in a dark or black state (fingerprint recognition can be utilized to unlock the screen). Alternatively, the OLED pixels located in the local region can be changed from one illuminating state to another illuminating state in a case that the display screen is in a bright state. The display driver can change the illumination properties of the OLED pixels by adjusting the driving electric current. The area of OLED illumination can be greater or equal to an area of a region of the screen touched by the finger. The illumination area can be adjusted within a certain range as needed.

Step S20 may include changing brightness of an organic luminescent material in the OLED display panel at a position corresponding to the touch position or a ratio of brightness of any two types of organic luminescent materials at a position corresponding to the touch position. According to demands, the OLED pixels are driven to emit light by adjusting the driving electric current to change brightness of OLED luminescent materials for three colors or to change a ratio of brightness of any two types of luminescent materials so as to make the light sensitivity become higher.

S30—utilizing an array of light sensitive units disposed in the OLED display panel to receive light reflected by a fingerprint at the touch position, and to transform optical signals into differential electrical signals to form a fingerprint image, based on differences between light rays reflected by fingerprint ridges and furrows. In this step, after the light emitted by the OLED display panel is reflected by the fingerprint, the light arrives at the array of light sensitive units. The array of light sensitive units generates electrical signals which are processed by a fingerprint recognition IC to form a fingerprint image.

In an embodiment of the present application, the OLED display panel includes a plurality of organic electroluminescence device, each of which includes an anode, a cathode, and an organic light emitting layer disposed between the anode and the cathode, the array of light sensitive units is located on a same film layer where the anode of the organic electroluminescence device is located on, and each of the light sensitive units is located at gaps between the anodes.

Other details of the under-screen optical fingerprint recognition method of the present application may be referred to the description of the OLED display panel in above context, and are not repeated herein.

The under-screen optical fingerprint recognition method of the present application makes the most of self-illumination properties of OLED pixels without a need to add an additional light source, utilizes the touch component to determine the position of the fingerprint, and makes the OLED pixels corresponding to a touched region irradiate light rays to realize the fingerprint recognition.

Above all, while the preferred embodiments of the present application have been illustrated and described in detail, it is intended that the present application should not be limited to the preferred embodiment. Various modifications and alterations which maintain the realm of the present application can be made by persons skilled in this art. The protective scope of the present application is subject to the scope as defined in the claims.

What is claimed is:

1. An organic light emitting diode (OLED) display panel, comprising:
a substrate;
a semiconductor layer, disposed above the substrate;
a first insulating layer, disposed on the semiconductor layer and above the substrate;
a gate electrode layer, disposed on the first insulating layer, the gate electrode layer forming a gate electrode of a semiconductor device;
a second insulating layer, disposed on the gate electrode layer and the first insulating layer;
a source drain metal layer, disposed on the second insulating layer and filling into a source electrode via and a drain electrode via formed in the first insulating layer and the second insulating layer, the source drain metal layer electrically connected to the semiconductor layer via the source electrode via and the drain electrode via, the source drain metal layer forming a source electrode and a drain electrode of the semiconductor device;
a third insulating layer, disposed on the source drain metal layer and the second insulating layer;
an anode layer, disposed on the third insulating layer and filling into an anode via formed in the third insulating layer, the anode layer electrically connected to the drain electrode of the semiconductor device via the anode via;
an organic light emitting layer, disposed on the anode layer;
a cathode layer, disposed on the organic light emitting layer;

an organic electroluminescence device, comprising an anode formed by the anode layer, the organic light emitting layer, and a cathode formed by the cathode layer;

a fourth insulating layer, disposed on the anode layer and the third insulating layer, the fourth insulating layer perforated to form a device via, the light emitting layer and the cathode of the organic electroluminescence device sequentially disposed on the anode layer via the device via;

a light sensitive layer, disposed on the third insulating layer and covered by the fourth insulating layer, configured to receive reflected light generated when light emitted by the organic light emitting layer of the organic electroluminescence device is reflected by a fingerprint, and to transform optical signals into differential electrical signals to form a fingerprint image, based on differences between light rays reflected by fingerprint ridges and furrows;

a thin film encapsulation layer, disposed above the organic electroluminescence devices and the light sensitive layer, the thin film encapsulation layer comprising an inorganic layer and an organic layer for avoiding invasion of oxygen and moisture;

a touch electrode layer, disposed above the thin film encapsulation layer, configured to detect a touch operation;

a dielectric layer, disposed between the thin film encapsulation layer and the touch electrode layer; and a light blocking layer, disposed between the thin film encapsulation layer and the dielectric layer, the light blocking layer having a plurality of first regions and a plurality of second regions, the first regions having a first light transmittance and the second regions having a second light transmittance lower than the first light transmittance, the first regions of the light blocking layer disposed corresponding to a light emitting region of the organic electroluminescence device and the light sensitive layer.

2. The OLED display panel according to claim 1, wherein the third insulating layer is a flat layer and the fourth insulating layer is a pixel defining layer.

3. An organic light emitting diode (OLED) display panel, comprising:

an OLED module functional layer, comprising a plurality of film layer;

a plurality of organic electroluminescence devices, distributed in the OLED module functional layer, each organic electroluminescence device comprising an anode, a cathode, and an organic light emitting layer disposed between the anode and the cathode;

a plurality of semiconductor devices, each of which comprises a thin-film transistor that is disposed corresponding to the organic electroluminescence display device and configured to drive the organic electroluminescence device to make the organic light emitting layer emit light;

a light sensitive layer, distributed in the OLED module functional layer, located on a same film layer where the anode of the organic electroluminescence device is located on, and located at gaps between the anodes, the light sensitive layer configured to receive reflected light generated when light emitted by the organic light emitting layer of the organic electroluminescence device is reflected by a fingerprint, and to transform optical signals into differential electrical signals to form a fingerprint image, based on differences between light rays reflected by fingerprint ridges and furrows;

a thin film encapsulation layer, disposed above the organic electroluminescence devices and the light sensitive layer, the thin film encapsulation layer comprising an inorganic layer and an organic layer for avoiding invasion of oxygen and moisture;

a touch electrode layer, disposed above the thin film encapsulation layer, configured to detect a touch operation;

a dielectric layer, disposed between the thin film encapsulation layer and the touch electrode layer; and a light blocking layer, disposed between the thin film encapsulation layer and the dielectric layer, the light blocking layer having a plurality of first regions and a plurality of second regions, the first regions having a first light transmittance and the second regions having a second light transmittance lower than the first light transmittance, the first regions of the light blocking layer disposed corresponding to a light emitting region of the organic electroluminescence device and the light sensitive layer.

4. The OLED display panel according to claim 3, further comprising:

a substrate;

a semiconductor layer, disposed above the substrate;

a first insulating layer, disposed on the semiconductor layer and above the substrate;

a gate electrode layer, disposed on the first insulating layer, the gate electrode layer forming a gate electrode of a semiconductor device;

a second insulating layer, disposed on the gate electrode layer and the first insulating layer;

a source drain metal layer, disposed on the second insulating layer and filling into a source electrode via and a drain electrode via formed in the first insulating layer and the second insulating layer, the source drain metal layer electrically connected to the semiconductor layer via the source electrode via and the drain electrode via, the source drain metal layer forming a source electrode and a drain electrode of the thin-film transistor of the semiconductor device; and a third insulating layer, disposed on the source drain metal layer and the second insulating layer.

5. The OLED display panel according to claim 4, further comprising:

an anode layer, disposed on the third insulating layer and filling into an anode via formed in the third insulating layer, the anode layer electrically connected to the drain electrode of the semiconductor device via the anode via, the anode layer forming the anode of the organic electroluminescence device; and a fourth insulating layer, disposed on the anode layer and the third insulating layer, the fourth insulating layer perforated to form a device via, the light emitting layer and the cathode of the organic electroluminescence device sequentially disposed on the anode layer via the device via.

6. The OLED display panel according to claim 5, wherein the light sensitive layer is disposed on the third insulating layer and covered by the fourth insulating layer.

7. The OLED display panel according to claim 6, wherein the third insulating layer is a flat layer and the fourth insulating layer is a pixel defining layer.

* * * * *